United States Patent
Ellis

(10) Patent No.: US 6,281,724 B1
(45) Date of Patent: Aug. 28, 2001

(54) CIRCUIT FOR PARTIAL POWER-DOWN ON DUAL VOLTAGE SUPPLY INTEGRATED CIRCUITS

(75) Inventor: Denis Ellis, Lissaleen Patrickswell (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/195,183

(22) Filed: Nov. 17, 1998

(51) Int. Cl.$^7$ .................................................. H03L 7/00
(52) U.S. Cl. ......................... 327/143; 327/408; 327/534; 307/86
(58) Field of Search .............................. 327/65, 143, 407, 327/408, 530, 534, 535, 537, 419–434; 323/271; 307/84–87

(56) References Cited

U.S. PATENT DOCUMENTS

| | | | |
|---|---|---|---|
| 4,812,672 | * | 3/1989 | Cowan et al. ........................... 307/64 |
| 5,187,396 | * | 2/1993 | Armstrong et al. .................... 327/65 |

* cited by examiner

*Primary Examiner*—Tuan T. Lam
*Assistant Examiner*—Minh Nguyen
(74) *Attorney, Agent, or Firm*—Samuels, Gauthier & Stevens, LLP

(57) ABSTRACT

An integrated circuit chip having formed thereon a voltage control circuit supply adapted to provide one of a pair of voltages selectively in accordance with an operating mode of the circuit. The circuit includes a comparator circuit fed by the pair of voltage sources. A first switch is controlled by the comparator circuit. A first one of the pair of voltage sources is fed through a second switch which may be a transistor or a diode. An input of the first switch is fed to a second one of the pair of voltage sources. The comparator circuit is arranged to place the switch in a non-conducting condition in one operating mode to couple the first one of the pair of voltage sources to the output of the circuit while isolating the second one of the pair of voltage sources supplies from the output of the circuit during such operating mode, and to place the switch in a conducting condition in the other one of the operating modes to de-couple the first one of the pair of voltage sources from the output of the circuit while coupling the second one of the pair of voltage sources to the output of the circuit output during such other one of the operating modes. The standby voltage control circuit allows a higher voltage (e.g., +12 volts) to be power-down while a lower voltage (e.g., +5 volts) is still applied without forward biasing any internal diodes and thus keeping currents low. Such is accomplished by the internal second switch, the comparator, and the switch. In normal operation mode, the second switch is conducting; in power-down operation mode, the second switch is non-conducting the comparator closes the first switch connecting the output of the standby voltage control circuit to the lower voltage.

8 Claims, 5 Drawing Sheets

CIRCUIT FOR PARTIAL POWER-DOWN ON DUAL VOLTAGE SUPPLY INTEGRATED CIRCUITS

BACKGROUND OF THE INVENTION

This invention relates generally to integrated circuit voltage control circuits and more particularly to circuits which operate to control the application of two voltage supplies, or sources, one of such voltage sources being applied during a normal operating mode and the other being applied during a standby, or partial power-down mode.

As is known in the art, many systems, such as digital computer systems, are required to operate with two voltage sources, one for interfacing to the computer internally (e.g., 5 volts) and one for interfacing to external peripherals (e.g., 12 volts). An example of this would be an interface transceiver integrated circuit which takes signals from the computer and translates them to the higher voltages required by external peripherals. The problem with this is that in order to safely power-down such a device, both sources need to go to zero volts so that no current flows in this mode.

However, computers are now required to operate in a standby, or partial power-down mode where only one source is turned on and consumes little power, while the other source (generally the higher voltage source) is turned off. In traditional dual voltage source circuits, this mode of operation is not supported because if the 5 volt source is left on while the 12 volt source is turned off and allowed to go to 0 volts, significant current could begin to flow from the 5 volt source.

One technique used to provide dual voltages is a charge pump circuit. With such circuit, power from an external, typically 5 volt, source is also used to generate an internal, typically 10 volt, source. During one mode, charge pump is turned off and the internal 10 volt source is shorted internally to the external 5 volt source through an internal switch. However, if an external source is used to provide the higher voltage, say 12 volts, a problem can occur when the 12 volt source is allowed to drop while the 5 volts is still applied. For example, referring to FIGS. 1 and 2, an inverter made up of transistors MP1 and MN1, is a typical device which would be powered off a 5 volt source. However, when a 12 volt source is partially powered down, more particularly, if the 12 volt source is allowed to fall below the 5 volt source, excessive current will flow in an internal parasitic transistor device Q (shown in phantom in FIG. 2). The parasitic device Q is formed by the n-type substrate (i.e., the base of Q), the p-type material tied to the 5 volts (i.e., the emitter of Q), and the grounded p-type or p-well material (i.e., the collector of Q). This parasitic device will turn on when the 12 volt source drops below the 5 volt source by a Vbe allowing significant amounts of current to flow from the 5 volt source to ground.

SUMMARY OF THE INVENTION

In accordance with the present invention, an integrated circuit chip is provided having formed thereon a voltage control circuit. The voltage control circuit is adapted to couple to other circuits on the chip one of a pair of voltage sources fed to the control circuit selectively in accordance with an operating mode of the voltage control circuit. The voltage control circuit includes a comparator circuit coupled to the pair of voltage sources. A first one of the pair of voltage sources is fed, through a second switch, to an output of the first switch, which provides the output for the voltage control circuit. An input of the first switch is coupled to a second one of the pair of voltage sources. The comparator circuit, first switch and second switch are arranged to place the first switch in a non-conducting condition and the second switch in a conducting condition in one of the operating modes with the second switch coupling the first one of the pair of voltage sources to the output of the voltage control circuit through the second switch while the non-conducting first switch isolates the second one of the pair of voltage sources from the output of the voltage control circuit during such one of the operating modes, and to place the first switch in a conducting condition and the second switch in a non-conducting condition in the other one of the operating modes with the non-conducting second switch de-coupling the first one of the pair of voltage sources from the output of the voltage control circuit while the conducting first switch couples the second one of the pair of voltage sources to the output of the voltage control circuit output during another one of the operating modes.

With such an arrangement, the first voltage source may safely fall towards ground since the second switch isolates the first voltage source from the second voltage source during the second-mentioned operating mode.

In accordance with another feature of the invention, the second switch comprises a diode.

With such an arrangement, the first voltage source may safely fall towards ground since the diode becomes reversed biased thereby isolating the first voltage source from the second voltage source.

In accordance with another feature of the invention, the semiconductor chip includes a substrate having a first type conductivity. The first switch includes a transistor having: a gate connected to an output of the comparator circuit; and one of the source/drain regions thereof connected to the second one of the voltage sources. The source/drain regions are formed in a region of the substrate having a type conductivity opposite to the type conductivity of the substrate.

In accordance with another feature of the invention, the diode is formed between the substrate and a first voltage contact region formed in the substrate.

In accordance with another feature of the invention, the first voltage contact region has the type conductivity opposite to the type conductivity of the substrate. The first voltage source is coupled to the substrate through the diode formed in the substrate.

In accordance with the invention, during the normal operating mode, a p-n junction between the substrate and the first voltage contact region provides the diode and such junction is forward biased conduction thereby electrically coupling the first voltage source to the substrate to provide an output for the voltage control circuit. During the standby mode, the first voltage source falls to ground, the p-n junction becomes reversed biased to electrically isolate the second voltage source from the first voltage.

In accordance with another feature of the invention, the transistor is a PMOS device, the substrate is n type conductivity and the source and drain regions of the transistor are p type conductivity.

In accordance with another feature of the invention, the second switch comprises a second transistor. In a one embodiment, second transistor is controlled by the output of the comparator.

BRIEF DESCRIPTION OF THE DRAWING

These and other features of the invention will become more readily apparent from the following detailed description when taken together with the following drawings, in which.

DESCRIPTION OF THE PREFERRED EMBODIMENTS

Figure 1:
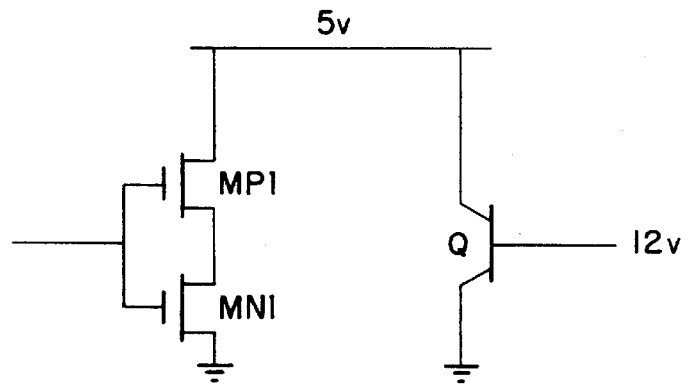
FIG. 1 is a schematic diagram showing a portion of a standby voltage control circuit connected to a device which uses such circuit according to the PRIOR ART.
Figure 2:
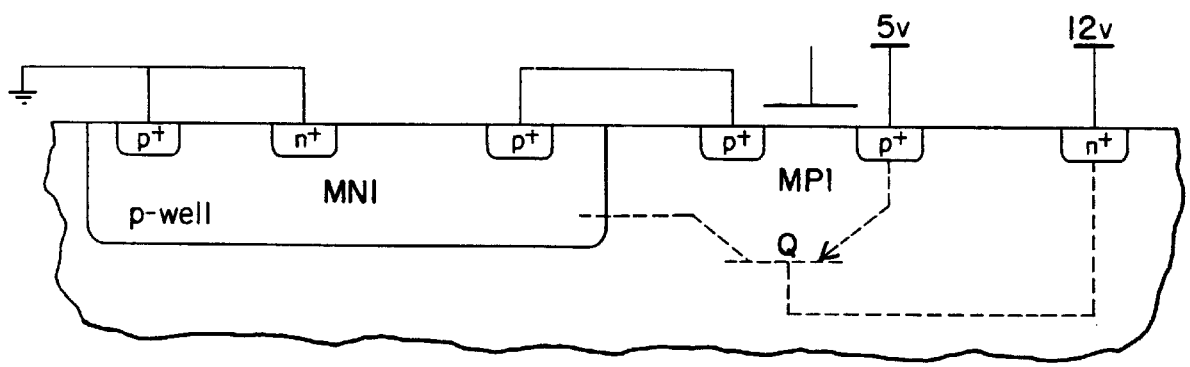
FIG. 2 is a cross-sectional sketch of a semiconductor chip having formed therein the circuit and device of FIG. 1 according to the PRIOR ART.
Figure 3:
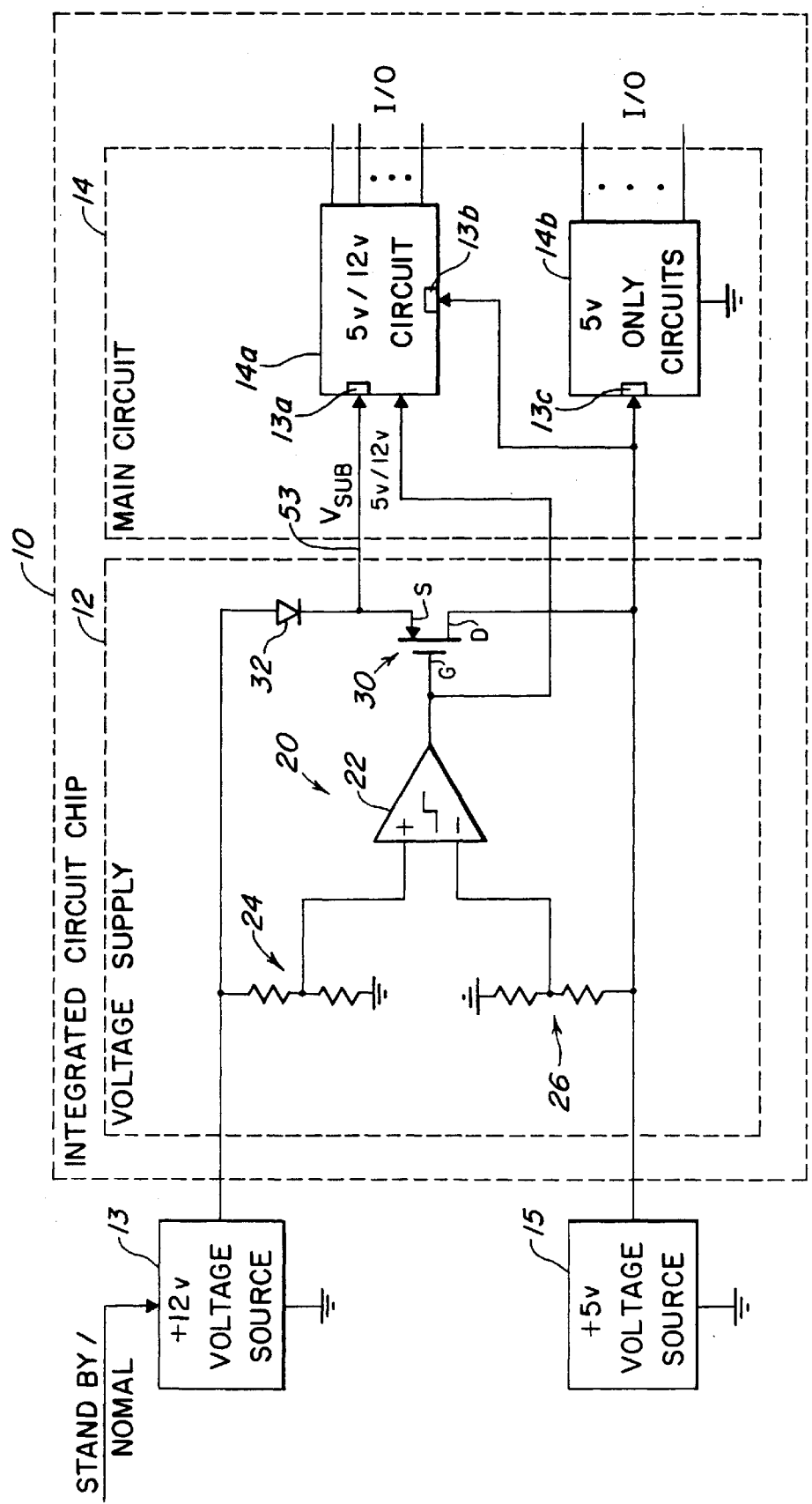
FIG. 3 is a schematic diagram of a standby voltage control circuit according to the invention, such circuit being adapted to provide one of a pair of voltage sources to other circuits on the chip selectively in accordance with an operating mode of the circuit.

Referring now to FIG. 3, an integrated circuit chip, here a silicon chip 10, is shown having formed therein using conventional integrated circuit fabrication techniques, a standby voltage control circuit 12 for supplying a selected one of two voltage fed to the circuit 12 to a main integrated circuit 14 also formed on chip 10. The main circuit 14 includes integrated circuitry 14a adapted to operate with either +12 volts, as during normal operation, or 5 volts, during a standby or partial power-down mode. The main circuit 14 also includes integrated circuitry 14b adapted to operate with +5 volts during both the normal and standby operating modes. Thus, circuit 14a has a pair of voltage input terminals; a first terminal 13a is a +12 volt and a second terminal 13b is a +5 volt terminal. The +12 volt terminal, as will be described, provides +12 volts to circuit 14a during normal operation and +5 volts during standby. The terminal 13b is connected to a +5 volt source 15. The circuit 14b has a terminal 13c for connected to the +5 volt source 15.

More particularly, the standby voltage control circuit 12 supplies a first one of the voltages, here the higher level voltage, for example, +12 volts, to the integrated circuit 14a during normal operation of such circuit 14a and the lower one of the two voltages, here for example, +5 volts, during a stand-by, or power-down mode. The +12 volt is supplied to a +12 volt grounded voltage source 13 external to the chip 10 and the +5 volt grounded voltage source 15 also external to the chip 10. The +12 volt source 13 is a switchable source controlled by a standby/normal control signal fed thereto. More particularly, the voltage source 13 is of any conventional design adapted to produce +12 voltsat its output during a normal operating mode and such output falls to ground during the standby mode.

More particularly, the standby voltage control circuit 12 includes a comparator circuit 20. The comparator circuit 20 includes a comparator 22 having its non-inverting input (+) coupled to +12 volts source 13 through a resistor voltage divider network 24, as shown. The comparator 22 has its inverting (−) input coupled to a +5 volts source 15 through a resistor voltage divider network 26, as shown. Also included in the standby voltage control circuit 12 is a switch, here a PMOS transistor 30. The comparator 22 has hysteresis such that, when the voltage at the input to the resistor divider network (i.e., the output of the +12 volt supply 13) falls below here +4.8 volts, the output of the comparator 22 goes low and when the voltage produced at the output of the +12 volt supply then rises above +5 volts the output of the comparator 22 goes high. Thus, there is here 200 millivolts of hysteresis in the comparator 22.

The transistor 30 has its gate G connected to the output of the comparator 22, its drain D connected to the +5 volts source 15, and its source S connected to the +12 volts source 13 through a second switch, here a diode 32, as shown. The source S provides the output of the standby voltage control circuit 12 (i.e., the voltage $V_{SUB}$ on line 53) and is connected to integrated circuit 14a, as shown.

In operation, during normal operation of the integrated circuit 14a, signal fed to the I/O of such circuit 14a are processed by the integrated circuit 14a in accordance with its designed function and such circuit 14a produces its processed output on the I/O. During this normal mode of operation by circuit 14a, the input voltage to the circuit 14a is here +12 volts. More particularly, during the normal mode, the +12 volts from source 13 is fed to the input of grounded resistor divider network 24. Further, it is noted that the +5 volts from source 15 is fed to the input of grounded resistor divider network 26. The resistors in the networks 24, 26 are arranged so that, in this normal mode, the voltage at the non-inverting input (+) of the comparator 22 is greater than the input at the inverting (−) input of comparator 22. Thus, as noted above, the output of comparator 22 is high and the transistor 30 is in a non-conducting state. In such non-conducting state, the +12 voltsis fed via the forward biased diode 32 to the provide +12 volt (minus one Vbe drop, i.e. about +11.3 volts) to the integrated circuit 14a, i.e., the voltage $V_{SUB}$ on line 53 is +11.3 volts. In effect, the transistor 30 acts as a switch which is controlled by the output of comparator 22. The input terminal to the switch 30 is the drain D and the output of the switch 30 is the source S.

In the stand-by mode, the +12 volts produced by source 13 drops towards ground. As noted above, when the voltage produced by the source 13 falls below here, for example, +4.8 volts the output of the comparator 22 goes low thereby turning transistor 30 on. The +5 volts produced by the +5 volt source 15 is thereby coupled to the source S of the transistor 30 reverse biasing diode 32. Thus, in response to such voltages, the comparator 22 output switches transistor 30 to a conducting condition and couples the +5 volts source through the conducting transistor 30 to now provide the lower +5 volt stand-by voltage to the integrated circuit 14a (i.e., $V_{SUB}$ on line 53 is now +5 volts) while the reverse biased diode electrically isolates the voltage source 13 from the voltage source 15.

It should be noted that with the standby voltage control circuit 12, the voltage at the input to resistor divider network 24 can, theoretically, drop to ground and the reverse biased diode 32 will prevent current flow from the +5 volts to the grounded +12 volts. Further, with such an arrangement, standby voltage control circuit 12 allows a higher voltage (e.g., +12 volts) to be power-down while a lower voltage (e.g., +5 volts) is still applied without forward biasing any internal diodes and thus keeping currents low. Such is accomplished by the internal diode 32, the comparator 20, and the switch 30. As noted above, in normal operation mode, the diode 32 is forward-biased; in standby, or power-down operation mode, the diode 32 is reverse biased and the comparator closes the switch 30 connecting the output of the standby voltage control circuit to the lower voltage. As noted above, because of the hysteresis of comparator 22, the output of the comparator 22 will again go high when the voltage of source 13 rises to 200 millivolts above +4.8 volts (i.e., when the voltage of source 13 rises to +5 volts). It should be noted that with this arrangement, the voltage $V_{SUB}$ is always less than one Vbe below +5 volts.

Figure 4:
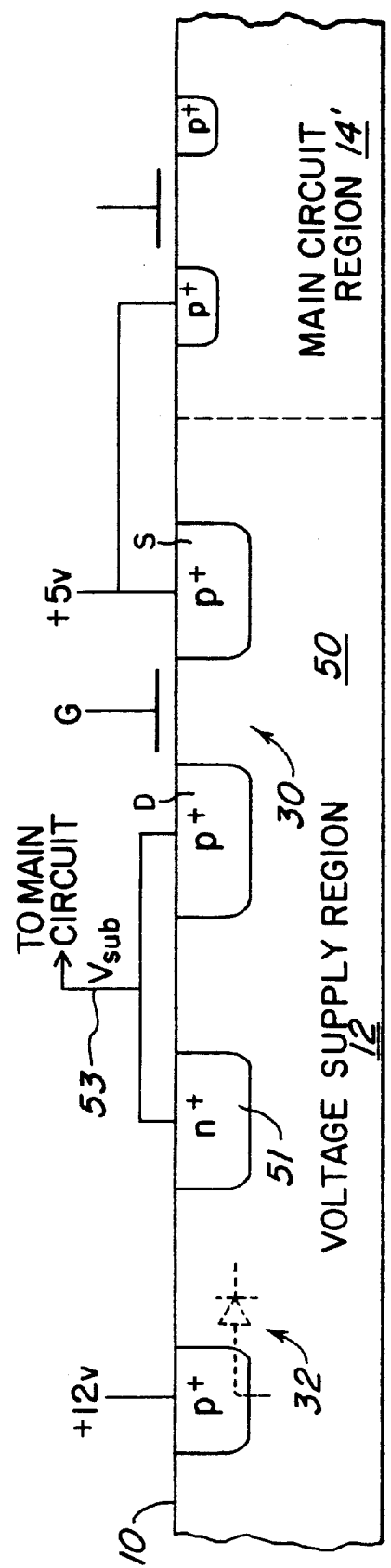
FIG. 4 is a cross-section diagrammatical sketch of a portion of a semiconductor chip having formed therein the circuit of FIG. 3, such portion showing a pMOS transistor switch and diode used in such circuit.

Referring now to FIG. 4, the semiconductor chip 10 is shown to include a substrate 50 having a first type conductivity, here n type conductivity. The switch, here PMOS transistor 30, has its gate G connected to the output of the comparator circuit 20, as described above, and the source S thereof connected to the +5 volts source 15, as described above. The source/drain regions, S/D, of the transistor 30 are formed in a region of the substrate having a p+type conductivity. The +12 volts source 13 is connected to the substrate 50 in an p+type conductivity ohmic contact region 58, as indicated. The diode 32 (FIG. 3, shown in phantom in FIG. 4) is provided in the substrate 50 (FIG. 4) by the p-n junction formed between the p+region 58 and the n substrate 50. The voltage $V_{SUB}$ on line 53 is coupled to the integrated circuit 14a through contact to an n+ohmic contact region 51 formed in the substrate 50; it being noted that such n+ohmic contact region 51 is connected to the p+source region of transistor 30 by conductor 53.

It should first be noted that the output voltage produced by standby voltage control circuit 12 (FIG. 3) to circuit 14a is the voltage produced on line 53. It is also noted that the diode 32 has its cathode provided by the n type conductivity substrate 50 and that the substrate 50 is electrically connected to conductor 53 through the ohmic contact region 51. More particularly, during the normal operating mode, a p-n junction, the diode 32 is, as described above, forward-biased thereby connecting the +12 volts from source 13 to line 53 through the ohmic contact region 51 and substrate 50 via the diode 32. It should be noted that the voltage on substrate 50 actually on line 53 will be one diode drop less than +12 volts, i.e., about +11.3 volts). On the other hand, when in the standby mode, the +12 voltsfalls to ground, as described, and the diode 32 becomes reversed biased. Therefore, the +12 volt source 13 remains isolated from +5 volt source 15 because of reverse biased diode 32 while the +5 volt source 15 is coupled to the substrate 50 to source +5 volts to circuit 14a.

Figure 5:
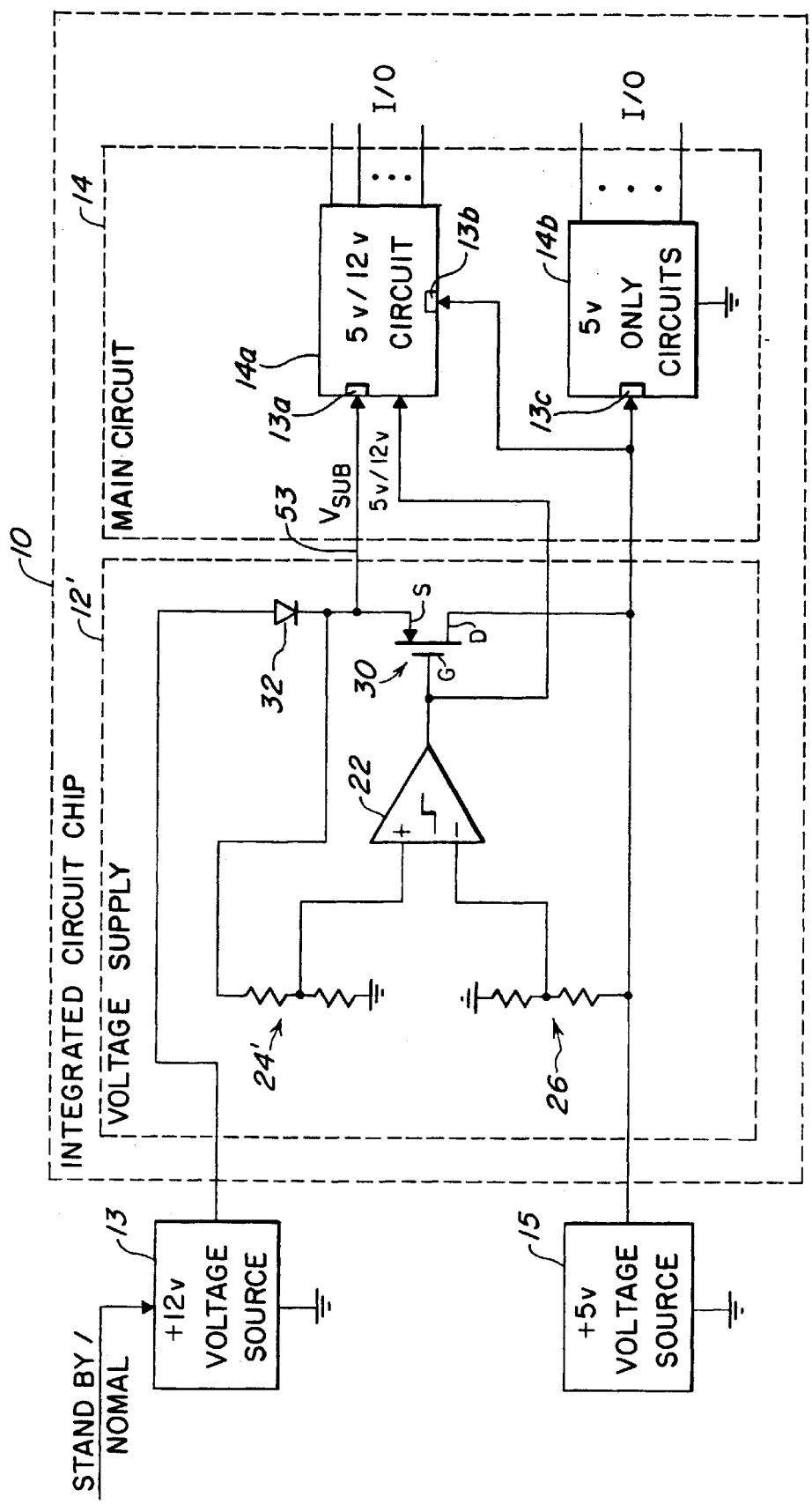
FIG. 5 is a schematic diagram of a standby voltage control circuit according to another embodiment of the invention, such circuit being adapted to provide one of a pair of voltage sources to other circuits on the chip selectively in accordance with an operating mode of the circuit.

Referring now to FIG. 5, another embodiment of a standby voltage control circuit, here circuit 12' is shown with like elements to circuit 12 (FIG. 3) having the same numerical designation. It is noted that rather than having the voltage source 13 connected to the input of the resistor divider 24 as in FIG. 3, the cathode of diode 32 (which is, when conducting one Vbe drop less than the voltage of source 13) coupled to the input of the resistor divider network 24', as shown. Thus, the + input of comparator 22 is again coupled to the +12 volt source 13, but here the source 13 is coupled to the + input of the comparator through diode 32.

Figure 6:
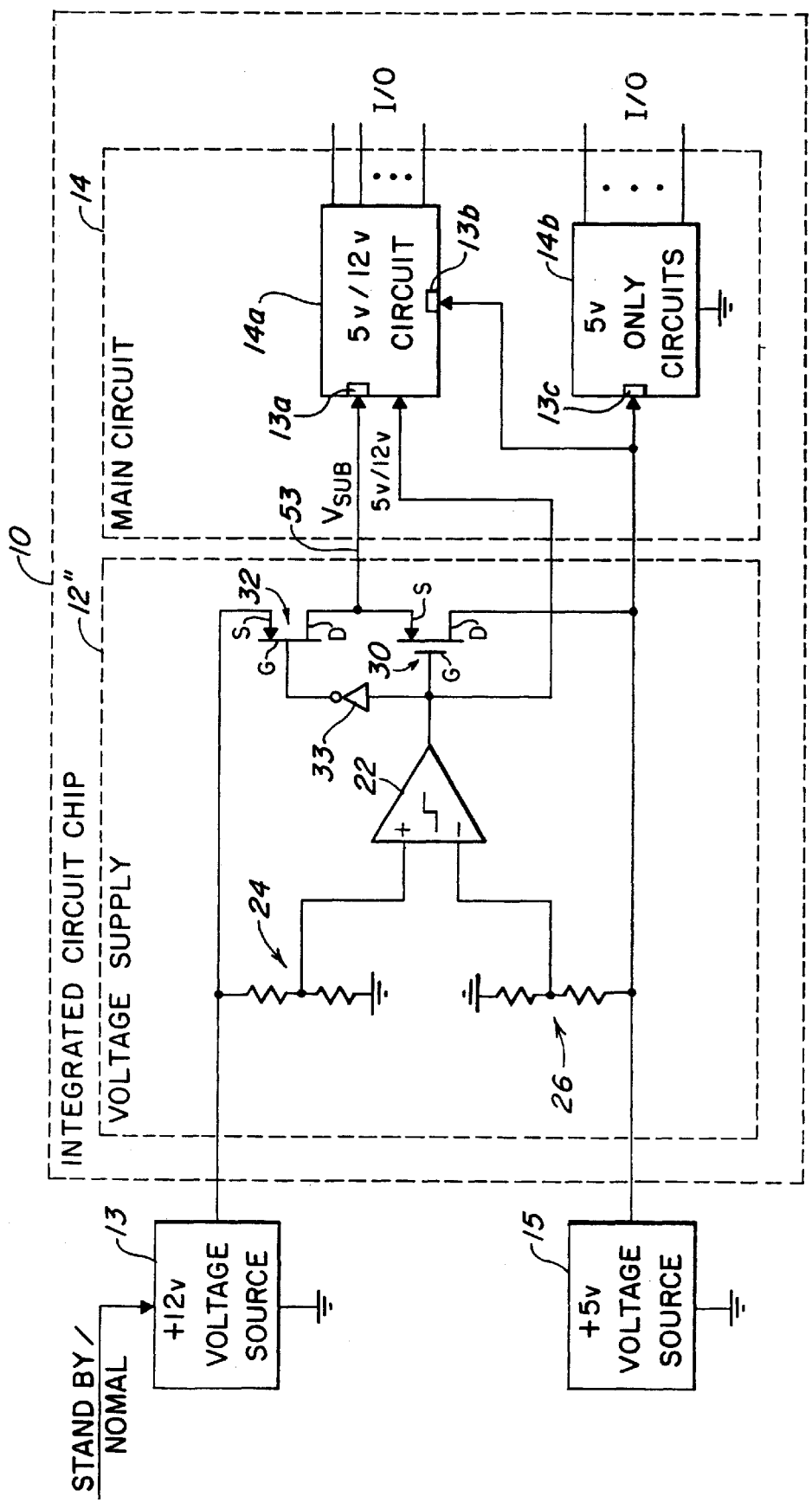
FIG. 6 is a schematic diagram of a standby voltage control circuit according to another embodiment of the invention, such circuit being adapted to provide one of a pair of voltage sources to other circuits on the chip selectively in accordance with an operating mode of the circuit.

Referring now to FIG. 6, another embodiment of a standby voltage control circuit, here circuit 12''' is shown with like elements to circuit 12 (FIG. 3) having the same numerical designation. It is noted that rather than having the second switch as a diode 32 in FIG. 3, here the second switch includes a second pMOS transistor 32'. The pMOS transistor 32' has its source S connected to the +12 volt Supply 13, is drain D connected to the source S of transistor 30, and its gate G connected to the output of the comparator 22 through an inverter 33. as shown.

In operation, during the normal mode, the +12 volts from source 13 is fed to the input of grounded resistor divider network 24. Further, it is noted that the +5 volts from source 15 is fed to the input of grounded resistor divider network 26. The resistors in the networks 24, 26 are arranged so that, in this normal mode, the voltage at the non-inverting input (+) of the comparator 22 is greater than the input at the inverting (−) input of comparator 22. Thus, as noted above, the output of comparator 22 is high and the transistor 30 is in a non-conducting state and because of inverter 33, the second switch i.e., transistor 32' is on (i.e., in a conducting condition). In such condition, the +12 volts is fed via the conducting transistor 32' to the provide +12 volt to the integrated circuit 14a.

In the stand-by mode, the +12 volts produced by source 13 drops towards ground. As noted above, when the voltage produced by the source 13 falls below here, for example, +4.8 volts the output of the comparator 22 goes low thereby turning transistor 30 on and, because of the inverter 33, transistor 32' is turned off. The +5 volts produced by the +5 volt source 15 is thereby coupled to the source S of the transistor 30. Thus, in response to such voltages, the comparator 22 output switches transistor 30 to a conducting condition and couples the +5 volts source through the conducting transistor 30 to now provide the lower +5 volt stand-by voltage to the integrated circuit 14a (i.e., $V_{SUB}$ on line 53 is now +5 volts) while the off transistor 32' electrically isolates the voltage source 13 from the voltage source 15.

Other embodiments are within the spirit and scope of the appended claims. For example, the output of the comparator 22, which provides an indication of whether the standby voltage control circuit 12 is supply a standby mode voltage or a normal mode voltage may be fed to the circuit 14a to provide such circuit with knowledge of the standby voltage control circuit's operating mode, as indicated in FIG. 3. Further, the resistor divider networks 24 and 26 may be removed with the voltage sources 13 and 15 being connected directly to the + and − inputs of comparator 22. Likewise, the resistor divider network 24' may be removed with the cathode of the diode 32 being connected to the + input of comparator 22. Still further, the transistor 32' can be a bipolar transistor.

What is claimed is:

1. An integrated circuit chip having formed thereon a voltage control circuit, such circuit comprising:

a comparator circuit adapted for coupling to first and second voltage sources;

a switch electrically coupled to the comparator circuit and the second voltage source and controlled by the comparator circuit; and a diode electrically coupled between the first voltage source and the switch;

an output of the first voltage source being fed, through the diode, to an output of the switch, an input of the switch being coupled to an a output of the second voltage source;

wherein the comparator circuit, switch and diode are arranged to place the switch in a non-conducting condition and the diode in a conducting condition in a first operating mode to couple the first voltage source to the output of the voltage control circuit through the conducting diode while the non-conducting switch isolates the output of the second voltage source from the output of the voltage control circuit during the first operating mode, and to place the switch in a conducting condition and the diode in a non-conducting condition in a second operating mode, the non-conducting diode de-coupling the output of the first voltage source from the output of the voltage control circuit while the conducting switch couples the output of the second voltage source to the output of the voltage control circuit output during the second operating mode;

wherein the integrated circuit chip includes a substrate having a first type conductivity;

wherein the switch includes a transistor having:
  a gate connected to an output of the comparator circuit; and
  one of the source/drain regions thereof connected to the voltage of the second voltage source;

wherein source/drain regions of the transistor are formed in a region of the substrate having a type conductivity opposite to the type conductivity of the substrate;

wherein the first voltage source is connected to the substrate through a first voltage contact region having the type conductivity opposite to the conductivity of the substrate;

wherein the diode is a diode formed in the integrated circuit chip;

wherein the diode, during the first operating mode, the diode being a p-n junction between the substrate and the first voltage contact region and with such junction being forward biased conduction, the first operating mode being when the output of the first voltage source is greater than the output of the second voltage source, electrically couples the first voltage source to the substrate to provide the output for voltage control circuit; and wherein the diode, during the second operating mode, the second operating mode being when the output of the first voltage source falls to ground potential and the output of the second voltage source remains unchanged, and with the p-n junction becoming reversed biased, electrically isolating the second voltage source from the first voltage source;

wherein the switch, during the second operating mode, is placed in a conducting condition.

2. The voltage control circuit recited in claim 1 wherein the transistor is a pMOS device, the substrate being n type conductivity and the source and drain regions of the transistor having p type conductivity.

3. The voltage control circuit recited in claim 1 wherein the comparator has hysteresis.

4. An integrated circuit chip having formed thereon a standby voltage control circuit adapted to provide one of a pair of voltages from first and second voltage sources selectively in accordance with an operating mode of the standby voltage control circuit, such circuit comprising:

a comparator circuit adapted for coupling to the first and second voltage sources;

a switch electrically coupled to the comparator circuit and the second voltage source and controlled by the comparator circuit; and a diode electrically coupled between the switch and the first voltage source; and wherein an output from the first voltage source is fed to an output of the switch through the diode and an input of the switch is fed a voltage from the second voltage source;

wherein the comparator circuit, switch and diode are arranged to place the switch in a non-conducting condition and the diode in a conducting condition in a non-standby operating mode to couple the output from the first voltage source to the output of the standby voltage control circuit while isolating the voltage from the second voltage source from the output of the standby voltage control circuit during the non-standby operating mode, and to place the switch in a conducting condition and the diode in a non-conducting condition in a standby operating model to de-couple the output from the first voltage source from the output of the standby voltage control circuit while coupling the output from the second voltage source to the output of the standby voltage control circuit output during the standby operating mode;

wherein the integrated circuit chip includes a substrate having a first type conductivity;

wherein the switch circuit includes a transistor having:
  a gate connected to an output of the comparator circuit; and
  one of the source/drain regions thereof connected to the second voltage source; and wherein source/drain regions of the transistor are formed in a region of the substrate having a type conductivity opposite to the type conductivity of the substrate; and wherein the first voltage source is connected to the substrate through a first voltage contact region having the type conductivity opposite to the conductivity of the substrate;

wherein the diode, during the non-standby operating mode, the diode being a p-n junction between the substrate and the first voltage contact region and with such junction being forward biased conduction, the non-standby operating mode being when the output of the first voltage source is greater than the output of the second voltage source, electrically couples the first voltage source to the substrate to provide the output for the standby voltage control circuit; and wherein the diode, during the standby operating mode, the standby operating mode being when the output from the first voltage source falls to ground potential and the output of the second voltage source remains unchanged, and with the p-n junction becoming reversed biased, electrically isolates the second voltage source from the first voltage source;

wherein the switch, during the standby operating mode, is placed in a conducting condition.

5. The standby voltage control circuit recited in claim 4 wherein the transistor is a pMOS device, the substrate being n type conductivity and the source and drain regions of the transistor having p type conductivity.

6. The standby voltage control circuit in claim 4 wherein the comparator has hysteresis.

7. An integrated circuit chip having formed thereon a voltage control circuit, such circuit comprising:

a comparator circuit adapted for coupling to first and second voltage sources;

a switch electrically coupled to said comparator circuit and said second voltage source and controlled by said comparator circuit; and a diode electrically coupled between said first voltage source, an input of said comparator through a voltage divider, and said switch;

an output of said first voltage source being fed, through said diode, to an output of said switch, an input of said switch being coupled to an output of said second voltage source;

said comparator circuit, switch, and diode being arranged to place said switch in a non-conducting condition and said diode in a conducting condition in a first operating mode to couple said first voltage source to the output of the voltage control circuit through the conducting diode while the non-conducting switch isolates the output of said second voltage source from the output of the voltage control circuit during the first operating mode, and to place said switch in a conducting condition and said diode in a non-conducting condition in a second operating mode, the non-conducting diode de-coupling the voltage of the first voltage source from the output of the voltage control circuit while the conducting switch couples the output of the second voltage source to the output of the voltage control circuit output during the second operating mode;

wherein the integrated circuit chip includes a substrate having a first type conductivity;

said switch including a transistor having a gate connected to an output of said comparator circuit and one of the source/drain regions thereof connected to the output of said second voltage source;

said source/drain regions of the transistor being formed in a region of the substrate having a type conductivity opposite to the type conductivity of the substrate;

said first voltage source being connected to the substrate through a first voltage contact region having the type conductivity opposite to the conductivity of the substrate;

said diode being a diode formed in the integrated circuit chip;

said diode, during the first operating mode, said diode being a p-n junction between the substrate and the first voltage contact region and with such junction being forward biased conduction, the first operating mode being when the output of said first voltage source is greater than the output of said second voltage source, electrically coupling said first voltage source to the substrate to provide the output for voltage control circuit; and said diode, during the second operating mode, the second operating mode being when the output of said first voltage source falls to ground potential and the output of said second voltage source remains unchanged, and with the p-n junction becoming reversed biased, electrically isolating said second voltage source from said first voltage source;

said switch, during the second operating mode, being placed in a conducting condition.

8. The integrated circuit chip as claimed in claim 7, wherein an anode of said diode is connected to the output of the first voltage source and a cathode of said diode is connected to a non-inverting input of said comparator via the voltage divider.

* * * * *